United States Patent
Menard

(10) Patent No.: US 8,912,912 B2
(45) Date of Patent: Dec. 16, 2014

(54) REMOTE IDENTIFICATION DEVICE ASSOCIATED WITH A VEHICLE INCLUDING MEANS FOR REMOTELY COMMUNICATING BATTERY STATE-OF-CHARGE INFORMATION WITH THE ASSOCIATED VEHICLE

(75) Inventor: Eric Menard, Cretell Cedex (FR)

(73) Assignee: Valeo Securite Habitacle, Creteil Cedex (FR)

( * ) Notice: Subject to any disclaimer, the term of this patent is extended or adjusted under 35 U.S.C. 154(b) by 473 days.

(21) Appl. No.: 13/255,959

(22) PCT Filed: Mar. 11, 2010

(86) PCT No.: PCT/EP2010/053134
§ 371 (c)(1),
(2), (4) Date: Nov. 28, 2011

(87) PCT Pub. No.: WO2010/108789
PCT Pub. Date: Sep. 30, 2010

(65) Prior Publication Data
US 2012/0068856 A1 Mar. 22, 2012

(30) Foreign Application Priority Data
Mar. 24, 2009 (FR) ...................................... 09 01391

(51) Int. Cl.
*G08B 21/00* (2006.01)
*G07C 5/00* (2006.01)
*G01R 31/36* (2006.01)
*G07C 9/00* (2006.01)

(52) U.S. Cl.
CPC ............ *G07C 9/00309* (2013.01); *G07C 5/008* (2013.01); *G01R 31/3606* (2013.01); *G07C 2209/62* (2013.01); *G07C 2009/00642* (2013.01)
USPC ....................................... 340/636.1; 340/455

(58) Field of Classification Search
CPC ............................... G01R 31/3606; G07C 5/008
USPC ............................. 340/438, 455, 636.1, 5.72
See application file for complete search history.

(56) References Cited

U.S. PATENT DOCUMENTS

| 4,929,880 A | 5/1990 | Henderson et al. |
| 5,561,331 A | 10/1996 | Suyama et al. |
| 8,013,759 B1* | 9/2011 | Aid et al. ...................... 340/904 |
| 2005/0134477 A1* | 6/2005 | Ghabra et al. ........... 340/825.72 |

FOREIGN PATENT DOCUMENTS

| FR | 2827711 A1 | 1/2003 |
| GB | 2409317 A | 6/2005 |

OTHER PUBLICATIONS

International Search Report issued in PCT/EP2010/053134, mailed on Jun. 21, 2010, with translation, 6 pages.

* cited by examiner

*Primary Examiner* — Jeffery Hofsass
(74) *Attorney, Agent, or Firm* — Osha Liang LLP

(57) ABSTRACT

The invention relates to a device (1) for remotely identifying a motor vehicle (2), including means (3) for remotely communicating with the associated vehicle (2). The device comprises means (4) for querying the state of charge of at least one vehicle battery and means (6) for receiving said state of charge.

9 Claims, 2 Drawing Sheets

REMOTE IDENTIFICATION DEVICE ASSOCIATED WITH A VEHICLE INCLUDING MEANS FOR REMOTELY COMMUNICATING BATTERY STATE-OF-CHARGE INFORMATION WITH THE ASSOCIATED VEHICLE

The present invention relates to a remote identification device for a user of an automotive vehicle, in particular for such a vehicle to be accessed and/or started by the authorized user.

These days, automotive vehicles are equipped with sophisticated electronic locking and unlocking systems which effectively prevent the theft of a vehicle while allowing easy access to an authorized user.

In particular, in addition to the conventional key used to mechanically lock and unlock the doors of an automotive vehicle, the key head is provided on the one hand with an immobilizer in the form of a transponder whose code is interrogated via an antenna to authorize or prevent the starting of the vehicle, and on the other hand with a remote control that can be used to lock or unlock the openings of the vehicle remotely.

To further increase the user's peace of mind, the Applicant had proposed, in the application FR 2 657 643, a remote control with a display that makes it possible, among other things, to inform the driver as to the state of the openings of the vehicle (locked or unlocked), the fuel level in the tank and the time.

In a prior application as yet not published, the Applicant had envisaged registering, on a memory card contained in the identification device, the information relating to the level of charge of the vehicle when the user leaves the vehicle, this information being able to be consulted subsequently outside the vehicle on the display screen of the identification device.

In certain conditions, such as following changes of climatic conditions or after forgetting to switch off certain electrical devices (side lights, dome light, etc.), the level of charge of the battery may be greatly reduced compared to that initially stored, or even reach a critical threshold at which the vehicle can no longer be started.

Even more advantageously, this monitoring of the level of charge of the battery is beneficial with the increasing development of vehicles with full or partial electrical propulsion.

The distance that can be travelled by the vehicle, in particular for an entirely electrically propelled vehicle, depends on the state of charge of the propulsion battery or batteries.

Thus, it is important to enable the user of the electric vehicle to monitor the state of charge of the vehicle in real time and remotely.

The present invention aims to propose such a solution enabling the user to be informed in real time, that is to say with frequently updated data, concerning the state of charge of the battery or batteries of the vehicle.

To this end, the subject of the invention is a device for remotely identifying an automotive vehicle, including means for remotely communicating with the associated vehicle, characterized in that it comprises means capable of remotely receiving the state of charge of at least one battery of the vehicle.

The invention may also include one or more of the following characteristics, taken alone or in combination:

it includes means for controlling the locking/unlocking of the vehicle and it includes means for activating said interrogation means which are configured to activate the interrogation means when a vehicle locking command is sent, the activation means are configured to stop the interrogation means, when a vehicle unlocking command is sent, the interrogation means are configured to query the state of the at least one battery at regular intervals, the reception means are configured to compare the state of the battery with the state of the at least one battery received on the preceding interrogation and the interrogation interval is extended if the two states are substantially equal, it includes means for displaying the state of charge of the at least one battery received by the reception means, it includes means for transferring the state of charge of the at least one battery received to a telecommunication device, the transfer means use the Bluetooth™ technology, the associated vehicle is a vehicle with full or partial electrical propulsion.

Other advantages and features will become apparent from reading the description of the invention, and the appended drawings in which.

Figure 1:
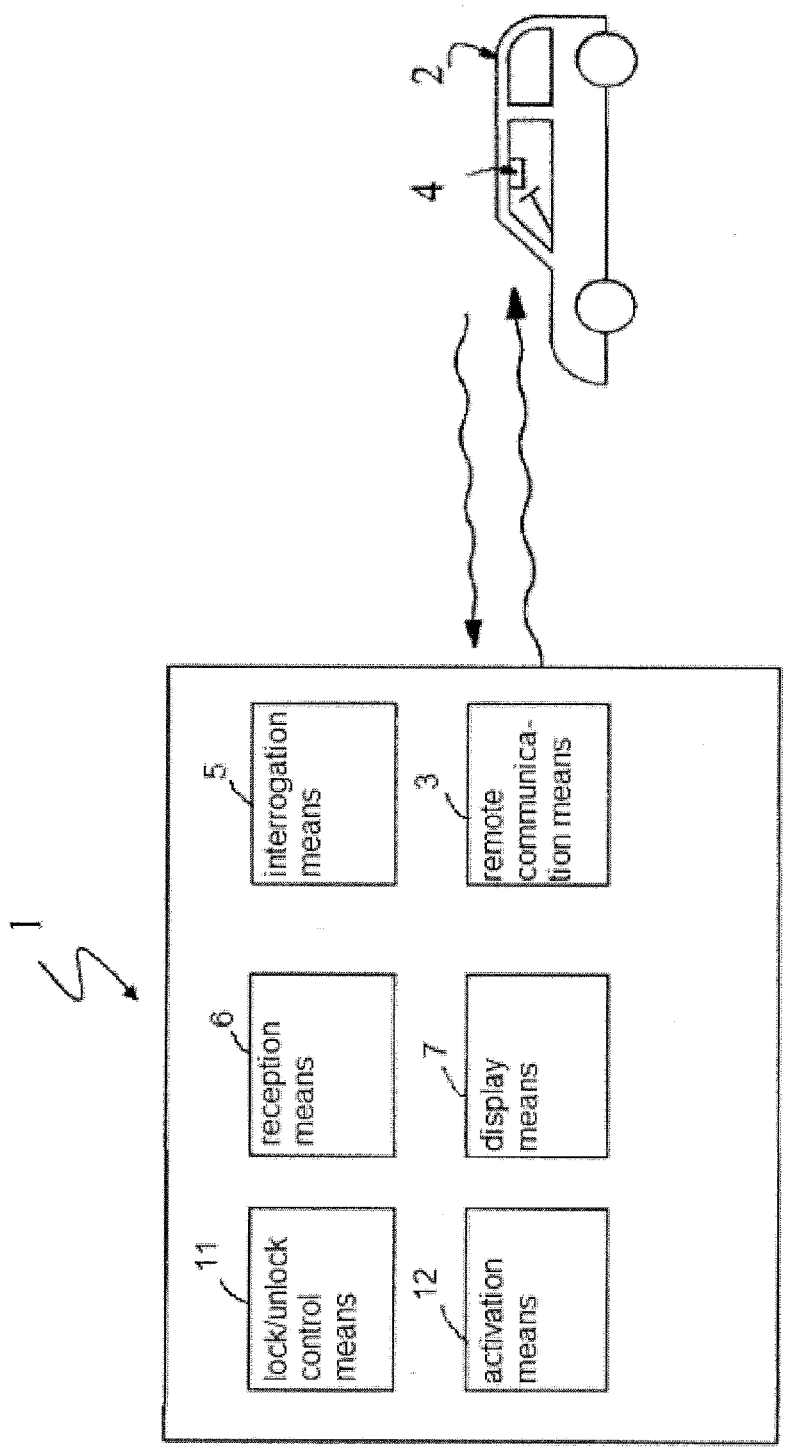
FIG. 1 is a block diagram of the device according to a first embodiment.

There now follows a description of the first embodiment of the invention with reference to FIG. 1.

FIG. 1 is a block diagram of the device according to the invention showing a device 1 for remotely identifying an automotive vehicle 2 associated with the identification device 1. The vehicle 2 may be a vehicle with at least partial electrical propulsion using at least one propulsion battery. The vehicle may also have only one battery powering the secondary electrical devices. The monitored state of charge may be the state of charge of a propulsion battery or of a battery powering secondary electrical devices, or both. In the case of a vehicle with at least partial electrical propulsion, the electrical propulsion is an important component, even a predominant component. The vehicles may be vehicles 100% propelled by electrical energy or hybrid vehicles whose electrical propulsion supports the heat propulsion, in particular in certain driving phases such as, for example, starting or up to a speed of a few tens of kilometers per hour.

This device 1 includes means 3 for remotely communicating with the associated vehicle 2 also equipped with communication means 4.

The communication means may, for example, communicate by a radiofrequency RF type link.

The device 1 includes means 5 for querying the state of charge of the propulsion battery of the vehicle and means 6 for receiving this state of charge received from the vehicle. In this first embodiment, the state of charge of the vehicle received by the reception means 6 can be viewed on display means 7.

The propulsion battery of the vehicle is the one used to power the propulsion electric motors, either as a support, such as, for example, for a hybrid vehicle, or as main engine for an entirely electric vehicle.

The display means 7 may be produced in the form of a simple display, even a two-color indicator (green for a sufficient state of charge and red for a state requiring the battery to be recharged), an LED bar or a screen, for example TFT.

Obviously, this identification device includes means 11 for controlling the locking/unlocking of the vehicle, that is to say, by sending, for example, a specific code, the vehicle 2 can be locked and unlocked. These means may be produced in the form of a remote control or else in the form of a hands-free access system for which the vehicle is locked and unlocked according to the location of the user inside or outside of a perimeter around the vehicle.

It has proven wise for the identification device 1 to include means 12 for activating said interrogation means 5 which are configured to activate the interrogation means 5 when a vehicle locking command is sent.

Thus, the interrogation of the state of charge of the propulsion battery is initiated only when the vehicle is locked.

According to another aspect, the activation means 12 are configured to stop the interrogation means 5, when a vehicle unlocking command is sent.

In order, to provide the user always with an up-to-the-minute state of charge, the interrogation means 5 are configured to interrogate the state of the propulsion battery at regular intervals, for example with a time interval of between 5 and 10 minutes.

To minimize the interrogations of the state of charge in order to save on the power supply for the identification device, for example a dry cell, provision is made to configure the interrogation means 5 so that the time interval between two successive interrogations depends on the comparison between the state of the propulsion battery with the state of the battery on the preceding interrogation. If the state of charge between the two interrogations turns out to be substantially identical (for example, a difference less than 0.5%), then the interrogation means 5 extend the time interval between two interrogations, for example by doubling it. This can be done up to a certain predefined upper limit, for example 1 to 5 hours. If, in this mode of operation, the state of charge has reduced substantially, for example by 5% between two interrogations, the interrogation means 5 revert back to an interrogation according to the initial interval of between 5 and 10 minutes. In this latter case, a warning, for example on the display means 7, may warn the user. This latter case could, for example, occur in winter, on a significant drop in temperature affecting the state of charge of the battery.

The user is thus warned and can take the measures necessary to avoid being immobilized by an excessively low state of charge of the battery, for example by actuating an individual heating of the battery.

In the embodiment described above, the identification device emits an interrogation signal to the vehicle, to which the vehicle responds with a response signal including the battery state-of-charge information. In another embodiment, the vehicle emits an information signal including this battery charge information without having previously received an interrogation signal from the identification device. Thus, the identification device is no longer equipped with means for emitting such an interrogation and is less costly to produce and consumes less energy.

Also in this embodiment, to minimize the emissions of the state of charge in order to save on the power supply for the emission device of the vehicle (for example a dry cell), provision is made to configure the emission means of the vehicle 5 so that the time interval between two successive emissions depends on the comparison between the state of the propulsion battery with the state of the battery on the preceding emission. If the state of charge between the two emissions turns out to be substantially identical (for example, a difference less than 0.5%), then the emission means 5 extend the time interval between two emissions, for example by doubling it. This can be done up to a certain predefined upper limit, for example 1 to 5 hours. If, in this mode of operation, the state of charge has reduced substantially, for example by 5% between two emissions, the emission means 5 revert back to an emission according to the initial interval of between 5 and 10 minutes.

It has proven wise for the identification device 1 to include means 12 for activating said emission means 5 which are configured to activate the emission means 5 when a vehicle locking command is sent.

Thus, the emission of the state of charge of the propulsion battery is initiated only when the vehicle is locked.

According to another aspect, the activation means 12 are configured to stop the emission means 5, when a vehicle unlocking command is sent.

In order to provide the user always with an up-to-the-minute state of charge, the emission means 5 are configured to emit a signal including the propulsion battery state-of-charge information at regular intervals, for example with a time interval of between 5 and 10 minutes.

In order to reduce the costs of an identification device according to the invention, it is possible to consider eliminating the display means of the identification device.

Figure 2:
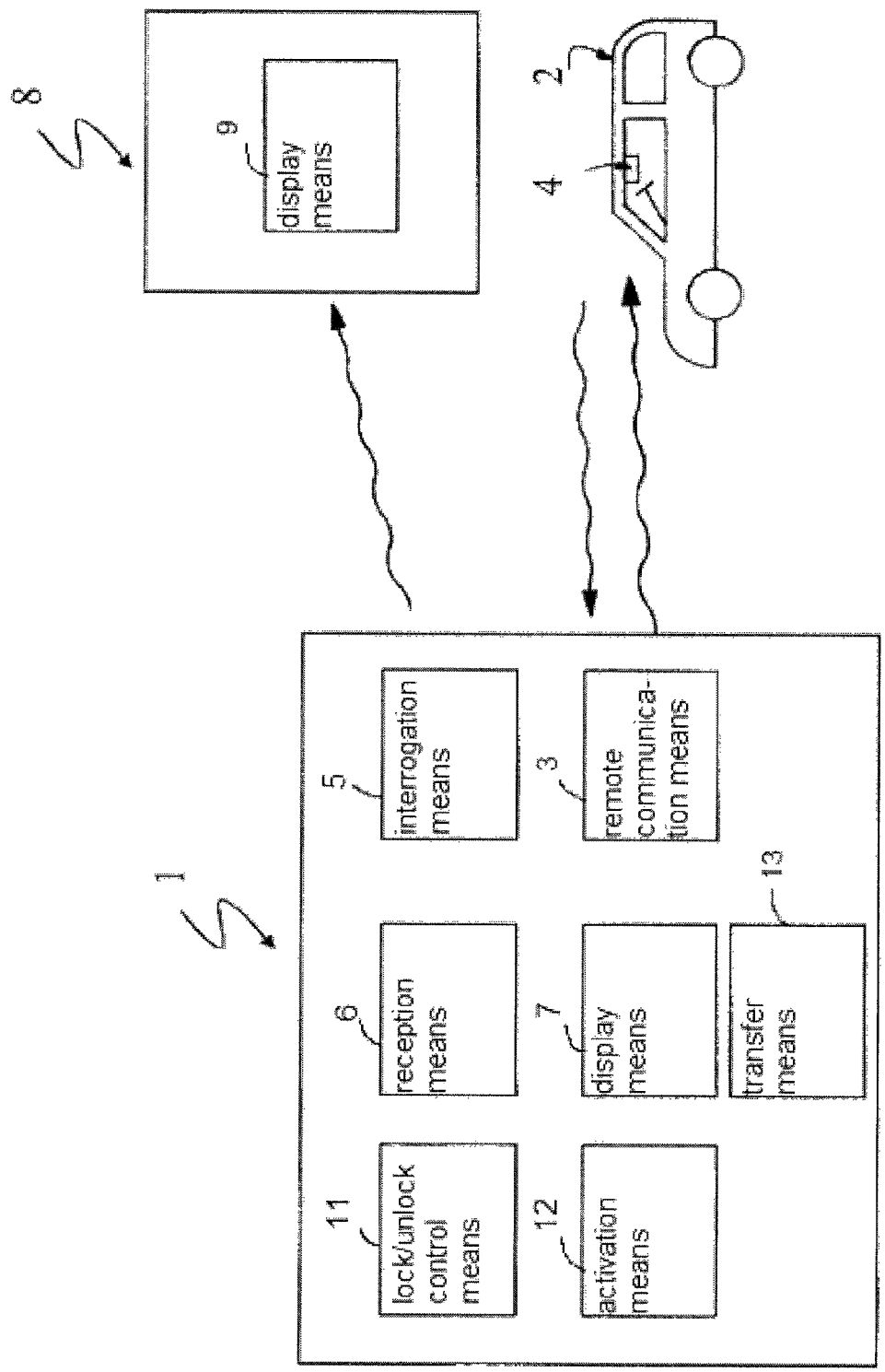
FIG. 2 is a block diagram of the device according to a second embodiment.

In a second embodiment illustrated in FIG. 2, the identification device 1 also includes transfer means 13 capable of transferring the vehicle battery state-of-charge information received by the reception means 6 to a telecommunication device 8 to be viewed on display means 9 of this telecommunication device 8.

In an economical embodiment not represented, it is possible to eliminate the display means 7 of the identification device 1.

Preferably, the transfer of the state of charge of the battery of the vehicle received by the identification device to the telecommunication device is conducted by Bluetooth™ technology.

Provision will therefore be made to configure the identification device 1 so that it is capable of communicating by Bluetooth™ technology.

The wireless Bluetooth™ technology is a short range communication system designed to replace the cables used previously in order to link portable peripheral devices and/or fixed electronic peripheral devices. The main characteristics of the wireless Bluetooth™ technology are its robustness, its low energy consumption and its low cost.

The main Bluetooth™ system comprises an RF transmitter-receiver, a baseband and a protocol stack. It offers services that make it possible to link peripheral devices which can then exchange different classes of data.

In order to exchange data, the appliances must be paired. The pairing is done by initiating discovery from an appliance and by exchanging a code. In certain cases, the code is free, and it is sufficient for the two appliances to input the same code. In other cases, the code is set by one of the two appliances (appliance without keyboard, for example), and the other must know it to connect thereto. Thereafter, the codes are stored, and it is sufficient for an appliance to request connection and for the other to accept it for the data to be able to be exchanged.

In another embodiment, the transfer by the Bluetooth™ technology is replaced by a transfer by the NFC (Near Field Communication) technology. Technically, the NFC technology is based on a contactless communication protocol between devices. This protocol uses the 13.56 MHz frequency band and allows for communication between two devices over distances of between 0 and 20 cm. It allows for a bit rate ranging up to 424 Kbit/s. It offers two modes of operation, the active mode and the passive mode. In active mode, the two communicating devices each generate their own carrier to convey the information. In passive mode, just one of the devices generates a magnetic field which powers the other device to enable it to transmit data.

In yet another embodiment, transfer of the vehicle battery state-of-charge information is conducted by infrared technology.

The telecommunication device may be a portable telephone, a PDA (personal digital assistant) or a laptop computer provided with telecommunication means.

In another embodiment of the identification device, it is also possible to consider transferring other information to the telecommunication device, such as the pressure of the tires, the temperature of the passenger compartment, the petrol level or any other information that could be deemed useful to be transferred to the user.

The invention claimed is:

1. A remote identification device, comprising:
   means for remotely communicating with communication means of a vehicle associated with the remote identification device, the remote communication means comprising interrogation means for interrogating a state-of-charge of at least one battery of the vehicle by being configured to emit at a time interval a state-of-charge interrogation signal to the vehicle, the time interval corresponding to a time between two successive interrogating signals,
   wherein the remote communication means comprise means for receiving the state-of-charge information concerning the at least one battery of the vehicle, and
   wherein the time interval between the two successive interrogating signals depends on a comparison between the state-of-charge of the at least one battery of the vehicle with the state-of-charge of the at least one battery of the vehicle on a preceding interrogation.

2. The remote identification device as claimed in claim 1, further comprising means for controlling the locking/unlocking of the vehicle and means for activating said interrogation and/or emission means which are configured to activate the interrogation and/or emission means when a vehicle locking command is sent.

3. The remote identification device as claimed in claim 1, wherein the activating means are configured to stop the interrogation means of the remote identification device when a vehicle unlocking command is sent.

4. The remote identification device as claimed in claim 1, wherein the time interval between the two successive interrogating signals is extended when the two compared states-of-charge of the at least one battery of the vehicle are substantially equal.

5. The remote identification device as claimed in claim 1, wherein the communication means of the vehicle comprise emission means that are configured to emit at a time interval, the time interval corresponding to a time between two successive emissions, a state-of-charge information signal concerning the at least one battery of the vehicle, the time interval between the two successive emissions depending on the comparison between the state-of-charge of the at least one battery of the vehicle with the state-of-charge of the at least one battery of the vehicle on a preceding emission.

6. The remote identification device as claimed in claim 1, further comprising display means capable of displaying the state-of-charge of said at least one battery received by the reception means.

7. The remote identification device as claimed in claim 1, further comprising means for transferring state-of-charge information concerning said at least one battery to a telecommunication device separate from the remote identification device.

8. The remote identification device as claimed in claim 7, wherein the means for transferring the state-of-charge of said at least one battery to the telecommunication device use Bluetooth™ technology.

9. The remote identification device as claimed claim 1, wherein the vehicle is a vehicle with at least partial electrical propulsion, wherein said at least one battery is used for the partial electrical propulsion.

* * * * *